(12) United States Patent
Tsai et al.

(10) Patent No.: US 11,588,074 B2
(45) Date of Patent: *Feb. 21, 2023

(54) LIGHT SOURCE DEVICE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Hsin-Wei Tsai, Kaohsiung (TW); Chien-Tien Wang, Taipei (TW); Shu-Hua Yang, Taichung (TW); Yu-Hung Su, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 205 days.

This patent is subject to a terminal disclaimer.

(21) Appl. No.: 16/777,508

(22) Filed: Jan. 30, 2020

(65) Prior Publication Data

US 2020/0251618 A1 Aug. 6, 2020

Related U.S. Application Data

(60) Provisional application No. 62/842,987, filed on May 3, 2019, provisional application No. 62/799,787, filed on Feb. 1, 2019.

(30) Foreign Application Priority Data

Dec. 10, 2019 (CN) .......................... 201911257615.1

(51) Int. Cl.
*H01L 33/48* (2010.01)
*H01L 33/38* (2010.01)
*H01L 23/552* (2006.01)

(52) U.S. Cl.
CPC .......... *H01L 33/486* (2013.01); *H01L 33/382* (2013.01); *H01L 23/552* (2013.01)

(58) Field of Classification Search
CPC ..... H01L 33/486; H01L 33/382; H01L 33/62; H01L 23/552
See application file for complete search history.

(56) References Cited

U.S. PATENT DOCUMENTS

2007/0164302 A1 7/2007 Tanda
2011/0204233 A1* 8/2011 Costello .................. G01S 17/04
250/338.4

(Continued)

FOREIGN PATENT DOCUMENTS

CN 102444807 A 5/2012
CN 203823501 U 9/2014

(Continued)

*Primary Examiner* — Su C Kim
(74) *Attorney, Agent, or Firm* — Li & Cai Intellctual Property (USA) Office

(57) ABSTRACT

A light source device includes a substrate, a light emitting unit, a frame, a light permeable member, and a metal shield. An upper electrode layer and a lower electrode layer of the substrate are respectively disposed on two opposite sides of the substrate, and are electrically coupled to each other. The light emitting unit is disposed on the upper electrode layer. The frame is disposed on the substrate and is arranged around the light emitting unit. The light permeable member is disposed on the frame and covers the light emitting unit. The metal shield is fixed to an inner side of the frame and is connected to the ground pad of the upper electrode layer. The metal shield is arranged around the outer side of the light emitting unit.

15 Claims, 16 Drawing Sheets

(56) References Cited

U.S. PATENT DOCUMENTS

| | | | |
|---|---|---|---|
| 2012/0062439 A1* | 3/2012 | Liao | H01Q 1/526 |
| | | | 343/841 |
| 2012/0160994 A1* | 6/2012 | Costello | G01D 11/245 |
| | | | 250/221 |
| 2017/0211790 A1 | 7/2017 | Lin | |
| 2017/0315313 A1* | 11/2017 | Cheng | G02B 6/4277 |
| 2019/0165218 A1* | 5/2019 | Nakai | H01L 33/52 |

FOREIGN PATENT DOCUMENTS

| | | |
|---|---|---|
| CN | 107195751 A | 9/2017 |
| CN | 107482099 A | 12/2017 |
| CN | 108365079 A | 8/2018 |
| CN | 207927072 U | 9/2018 |

* cited by examiner

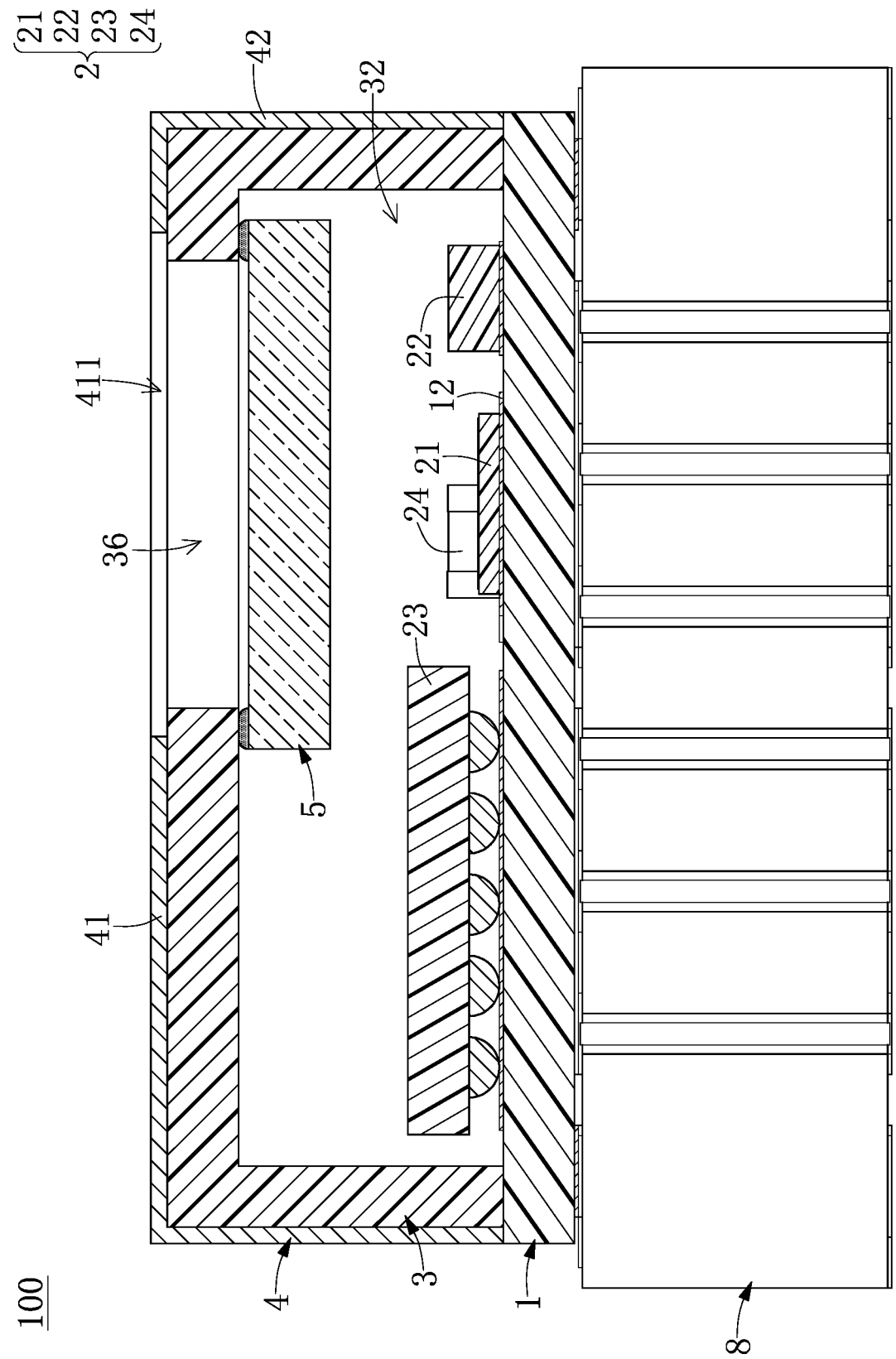

LIGHT SOURCE DEVICE

CROSS-REFERENCE TO RELATED PATENT APPLICATION

This application claims the benefit of priority to China Patent Application No. 201911257615.1, filed on Dec. 10, 2019 in People's Republic of China. The entire content of the above identified application is incorporated herein by reference.

This application claims priority from the U.S. Provisional Patent Application Ser. No. 62/799,787 filed Feb. 1, 2019, which application is incorporated herein by reference in its entirety, and the U.S. Provisional Patent Application Ser. No. 62/842,987 filed May 3, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source device, and more particularly to a light source device formed in a new package structure.

BACKGROUND OF THE DISCLOSURE

Conventional light source devices are formed in a Transistor Outline-CAN (TO-CAN) package structure, and have not been improved in recent years. Therefore, it has become more and more difficult for conventional light source devices to meet various requirements.

SUMMARY OF THE DISCLOSURE

In response to the above-referenced technical inadequacies, the present disclosure provides a light source device to effectively improve the issues associated with conventional light source devices.

The light source device in the present disclosure is formed with the electronic components arranged in the metal shield (i.e., the metal shield surrounds the outer side of the electronic components), so that the metal shield can be used to effectively prevent the electronic components from being interfered by external signals, thus providing a more stable operation of the electronic components.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 16 is a cross-sectional view taken along line XVI-XVI of FIG. 15.

DETAILED DESCRIPTION OF THE EXEMPLARY EMBODIMENTS

Figure 1:
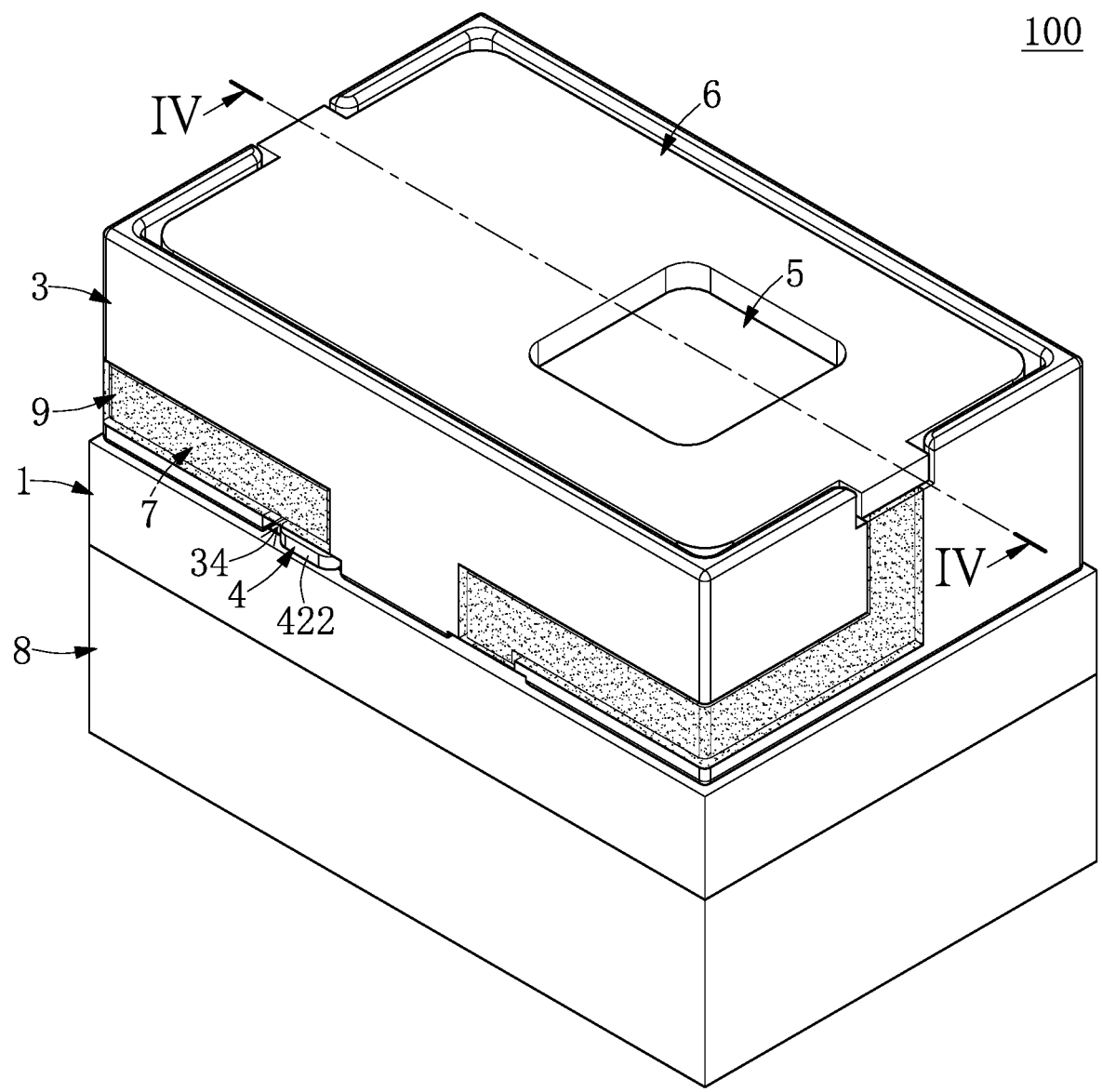
FIG. 1 is a perspective view of a light source device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a light source device 100. The light source device 100 includes a substrate 1, a plurality of electronic components 2 mounted on the substrate 1, a frame 3 disposed on the substrate 1, a metal shield 4 fixed to an inner side of the frame 3 and electrically coupled to the substrate 1, a light permeable member 5 disposed on the frame 3, a cover plate 6 disposed on the light permeable member 5 and fixed to the frame 3, a detection unit 7 electrically coupled to the substrate 1, and an uplift block 8 that provides for the substrate 1 to be disposed thereon.

It should be noted that the light source device 100 in the present embodiment includes the above components, but the present disclosure is not limited thereto. For example, in other embodiments of the present disclosure, the light source device 100 can be provided without at least one of the above components (e.g., the metal shield 4, the uplift block 8, the cover plate 6, or other components) according to design requirements. The following description describes the structure and connection relationship of each component of the light source device 100 of the present embodiment.

The substrate 1 includes a board 11 (e.g., an insulating board, such as a ceramic board or a resin board), an upper electrode layer 12 and a lower electrode layer 13 respectively disposed on two opposite sides of the board 11, and an inner circuit unit 14 (shown in FIG. 5) that is embedded in the board 11 and is connected to the upper electrode layer 12 and the lower electrode layer 13. In other words, the upper electrode layer 12 and the lower electrode layer 13 in the present embodiment are electrically coupled to each other through the inner circuit unit 14.

The board 11 includes a first surface 111 and a second surface 112 that is opposite to the first surface 111. The upper electrode layer 12 is formed on the first surface 111 and includes a ground pad 121 and a signal pad 122, and the lower electrode layer 13 is formed on the second surface 112. Moreover, the inner circuit unit 14 includes a plurality of metal pillars (not labeled), and two ends of each of the metal pillars are respectively connected to the upper electrode layer 12 and the lower electrode layer 13.

The electronic components 2 in the present embodiment include a light emitting unit 21, a photodetector 22, a driver chip 23, and a plurality of capacitors 24. Specifically, the light emitting unit 21, the photodetector 22, the driver chip 23, and the capacitors 24 are mounted on (or disposed on) the upper electrode layer 12, thereby being electrically coupled to each other through the upper electrode layer 12 (e.g., the driver chip 23 is electrically coupled to the light emitting unit 21 through the upper electrode layer 12 and/or inner circuit unit, and the capacitors 24 are electrically coupled to the driver chip 23 through the upper electrode layer 12 and/or inner circuit unit). It should be noted that the electronic components 2 can be provided without at least one of the above components other than the light emitting unit 21 (e.g., at least one of the capacitors 24, the photodetector 22, and the driver chip 23) according to design requirements, but the present disclosure is not limited thereto.

Figure 2:
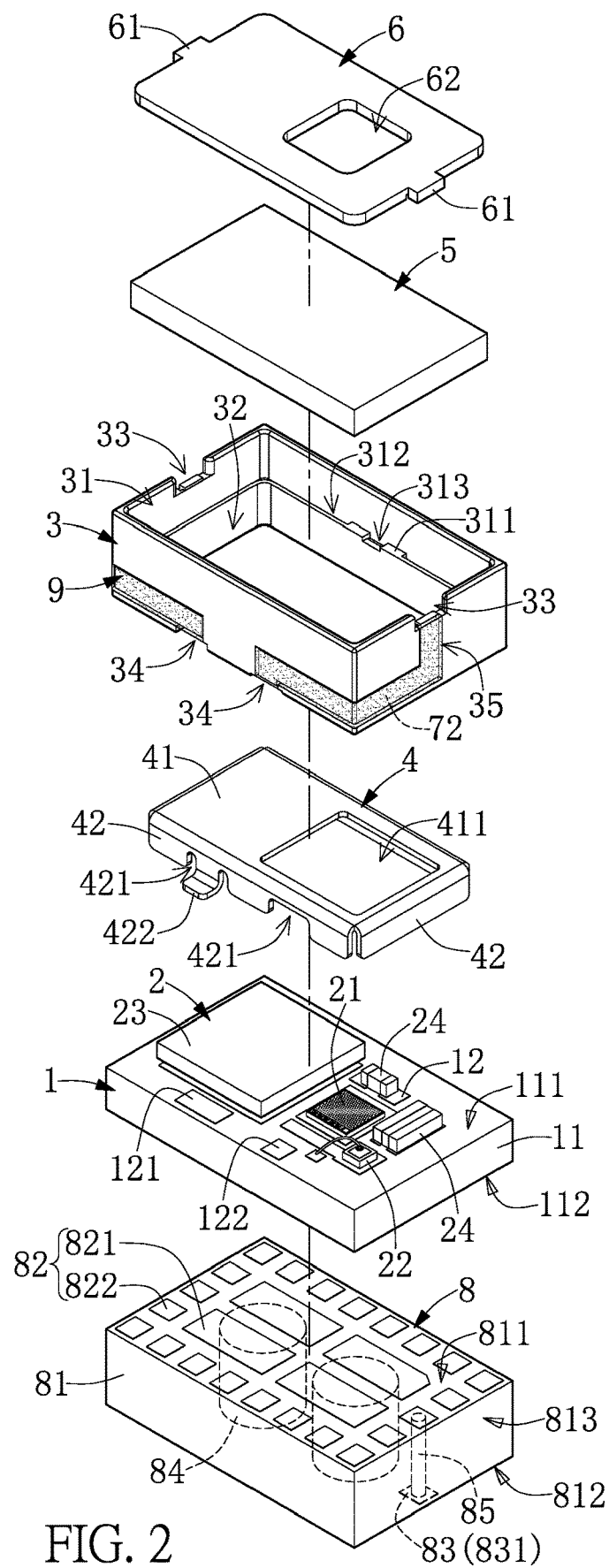
FIG. 2 is an exploded view of FIG. 1.
Figure 3:
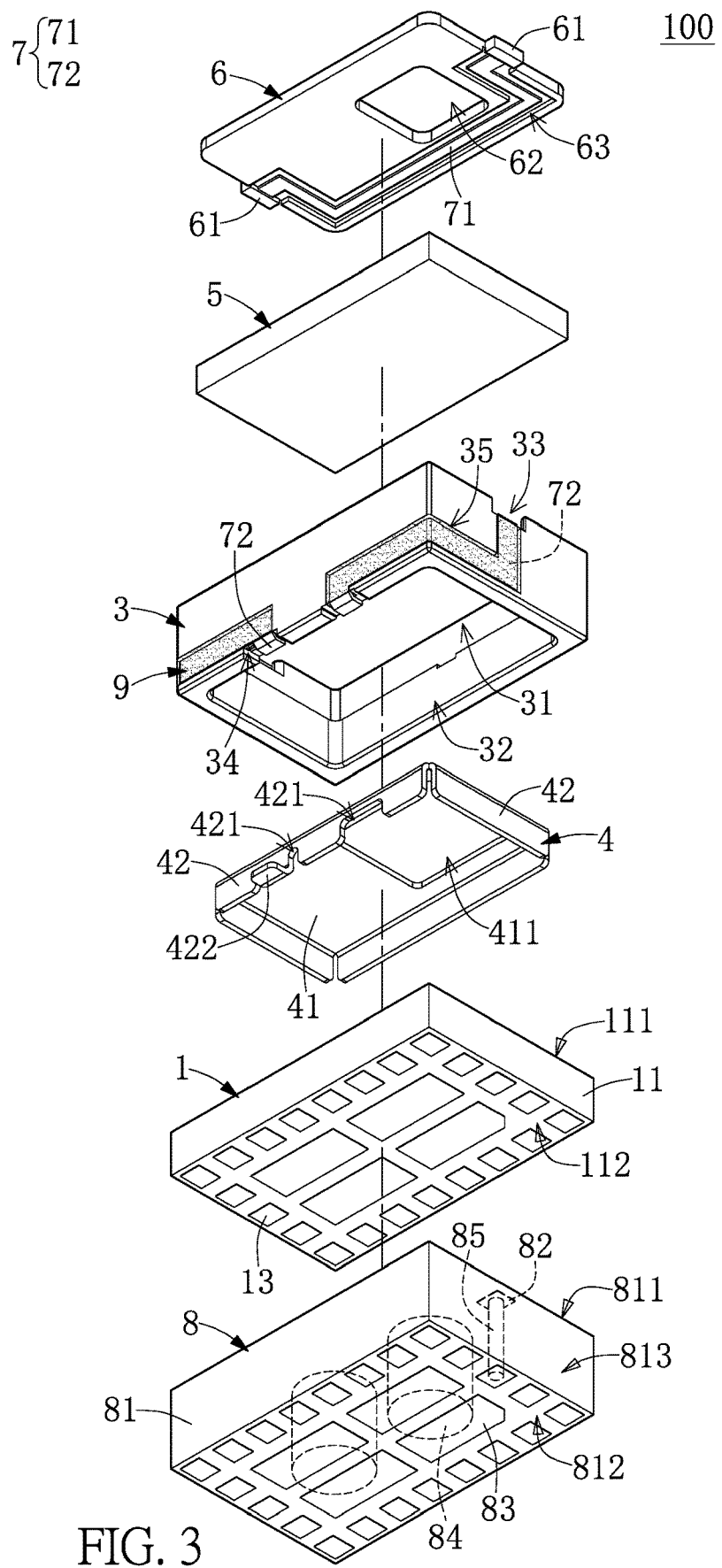
FIG. 3 is an exploded view of FIG. 1 from another angle of view.

Moreover, the light emitting unit 21, the photodetector 22, and the capacitors 24 in the present embodiment are arranged at the same side of the driver chip 23 (e.g., as shown in FIG. 2, the light emitting unit 21, the photodetector 22, and the capacitors 24 are disposed on a right half portion of the substrate 1, and the driver chip 23 is disposed on a left half portion of the substrate 1), and the capacitors 24 are arranged adjacent to the light emitting unit 21 and the photodetector 22. In addition, the ground pad 121 and the signal pad 122 of the upper electrode layer 12 are arranged adjacent to the same edge of the substrate 1, the ground pad 121 is arranged adjacent to the driver chip 23, and the signal pad 122 is arranged adjacent to the light emitting unit 21 or the photodetector 22.

Specifically, the light emitting unit 21 in the present embodiment is a Vertical-Cavity Surface-Emitting Laser (VCSEL) that can emit an infrared light, and the photodetector 22 in the present embodiment is a photodiode (PD) chip, but the present disclosure is not limited thereto. For example, in other embodiments of the present disclosure, the light emitting unit 21 can be at least one infrared light emitting diode (LED) chip.

The photodetector 22 in the present embodiment can be used to receive an invisible light emitted from the light emitting unit 21 and reflected by the light permeable member 5, thereby detecting a damage condition of the light permeable member 5 (or detecting a light signal of the light emitting unit 21). In addition, the photodetector 22 can be used for other detections according to design requirements.

The capacitors 24 in the present embodiment are two capacitors 24 having different sizes. Specifically, one of the two capacitors 24 is used for a voltage regulation of the light source device 100, and the other one of the two capacitors 24 is used to reduce an equivalent series inductance (ESL) of the light source device 100.

Figure 5:
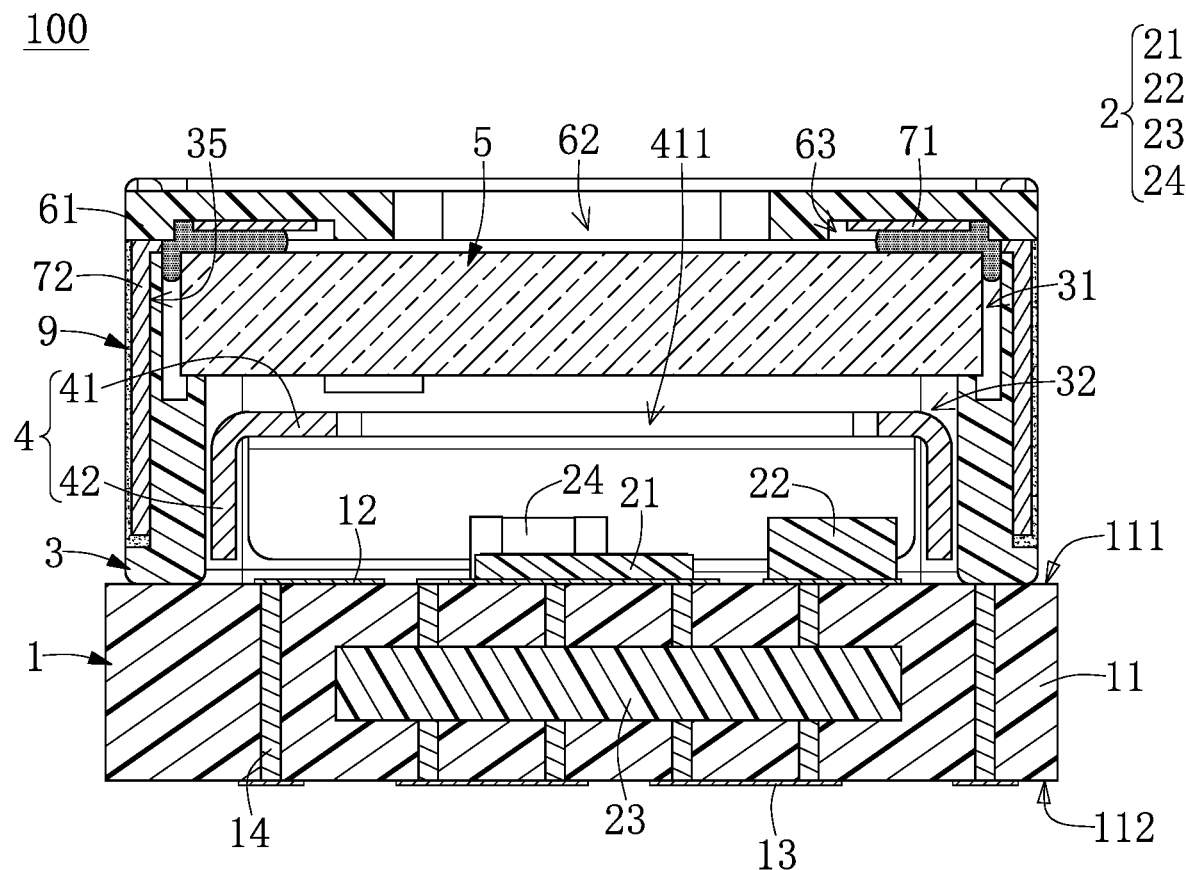
FIG. 5 is a cross-sectional view showing the light source device in another configuration when an uplift block is omitted according to the first embodiment of the present disclosure.

The driver chip 23 in the present embodiment is disposed on the upper electrode layer 12 of the substrate 1, but the present disclosure is not limited thereto. For example, as shown in FIG. 5, the driver chip 23 is embedded in the board 11 of the substrate 1, and the driver chip 23 is electrically coupled to the light emitting unit 21, the photodetector 22, the capacitors 24, and the lower electrode layer 13 through the inner circuit unit 14 that is embedded in the board 11. Moreover, the driver chip 23 is preferably located under the light emitting unit 21, the photodetector 22, and the capacitors 24.

Accordingly, the light emitting unit 21, the photodetector 22, the driver chip 23, and the capacitors 24 in the present embodiment are integrated in the light source device 100, so that signal transmission path of the electronic components 2 can be effectively shortened to reduce an inductance of the light source device 100. Moreover, the driver chip 23 of the light source device 100 is embedded in the board 11, so that the size of the light source device 100 can be effectively reduced and the inductance of the light source device 100 can be further reduced.

The frame 3 is in a rectangular ring shape. An inner side of the frame 3 has an accommodating slot 31 recessed in an upper half portion thereof and an accommodating space 32 that is formed in a lower half portion thereof. The accommodating space 32 is in spatial communication with the accommodating slot 31, and the accommodating slot 31 has an annular bottom 311 arranged adjacent to the accommodating space 32. The annular bottom 311 has a C-shaped glue-receiving channel 312 recessed therein and an air vent 313 that is arranged between two free ends of the C-shaped glue-receiving channel 312. The air vent 313 is not in spatial communication with the glue-receiving channel 312.

Moreover, the frame 3 has two troughs 33 recessed in a top side thereof, two notches 34 recessed in a bottom side thereof, and two circuit grooves 35 recessed in an outer surface thereof and being separate from each other. The two troughs 33 are respectively arranged on two short edges of the frame 3, the two notches 34 are arranged on one long edge of the frame 3, and the two circuit grooves 35 are formed by respectively extending from the two troughs 33 to the two notches 34. Specifically, each of the two circuit grooves 35 in the present embodiment is in a substantial L-shape. Moreover, a width of any one of the two circuit grooves 35 is less than or equal to that of the corresponding trough 33 and is also less than or equal to that of the corresponding notch 34, but the present disclosure is not limited thereto.

Figure 4:
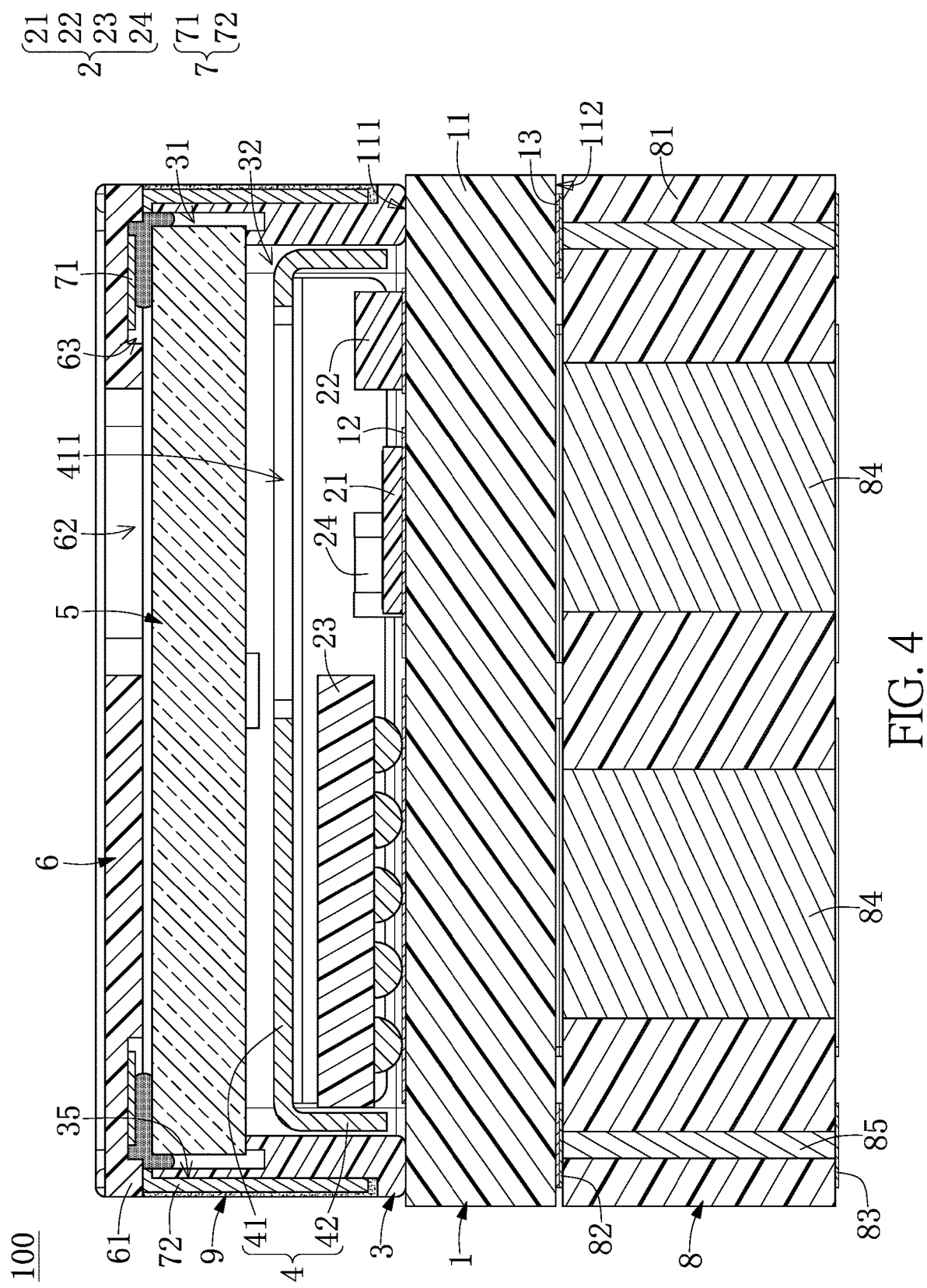
FIG. 4 is a cross-sectional view taken along line IV-IV of FIG. 1.

The bottom side of the frame 3 is disposed on the first surface 111 of the substrate 1 and surrounds an outer side of at least part of the electronic components 2. For example, as shown in FIG. 4, the frame 3 surrounds the outer side of entire of the electronic components 2. However, as shown in FIG. 5, the frame 3 surrounds an outer side of the light emitting unit 21, the photodetector 22, and the capacitors 24, but does not surround an outer side of the driver chip 23. In other words, at least part of the electronic components 2 surrounded by the frame 3 is arranged in the accommodating space 32.

Specifically, the bottom side of the frame 3 is disposed on a peripheral portion of the first surface 111, and the two notches 34 of the frame 3 respectively correspond in position to the ground pad 121 and the signal pad 122 of the substrate 1. In other words, the two circuit grooves 35 are formed by respectively extending from the two troughs 33 toward the ground pad 121 and the signal pad 122. The accommodating space 32 of the frame 3 can be in spatial communication with an external space outside of the frame 3 through the two notches 34, and the ground pad 121 and the signal pad 122 are exposed from the frame 3 (or are arranged outside of the accommodating space 32) through the two notches 34, respectively.

The metal shield 4 in the present embodiment includes a rectangular main plate 41 and a plurality of side plates 42 curvedly extending from edges of the main plate 41, and each of the side plates 42 is substantially and perpendicularly connected to the main plate 41, but the present disclosure is not limited thereto. For example, in other embodiments of the present disclosure, the metal shield 4 can be formed without a part of the side plates 42, or the side plates 42 can be integrally formed as a single one-piece structure.

Moreover, the main plate 41 of the metal shield 4 has an opening 411 that substantially occupies at least 50% of an area of the main plate 41. One of the side plates 42 of the metal shield 4 has two concavities 421 spaced apart from each other and a bent tail 422 that extends from one of the two concavities 421, and each of the other side plates 42 is a complete rectangle. Moreover, the bent tail 422 of the metal shield 4 in the present embodiment is formed by being extended from the concavity 421 that is arranged away from the opening 411.

Specifically, the metal shield 4 is fixed to (e.g., engaged into) the inner side of the frame 3 and is arranged in the accommodating space 32, thereby surrounding at least part of the electronic components 2. For example, as shown in FIG. 4, the metal shield 4 surrounds the outer side of entire of the electronic components 2. However, as shown in FIG. 5, the metal shield 4 surrounds the outer side of the light emitting unit 21, the photodetector 22, and the capacitors 24, but does not surround the outer side of the driver chip 23.

The opening 411 of the metal shield 4 corresponds in position to the light emitting unit 21 and the photodetector 22 (e.g., the light emitting unit 21 and the photodetector 22 are located under the opening 411), and the main plate 41 of the metal shield 4 at least covers the driver chip 23. The two concavities 421 respectively correspond in position to the ground pad 121 and the signal pad 122 of the substrate 1, and a lower surface of the bent tail 422 is connected to the ground pad 121 and is arranged in the corresponding notch 34 (shown in FIG. 1). In other words, a part of the bent tail 422 of the light source device 100 can be observed from the external space through the corresponding notch 34. An upper surface of the bent tail 422 is connected to a part of the transmission circuit 72 arranged in the corresponding notch 34.

Accordingly, the light source device 100 in the present embodiment is formed with the electronic components 2 arranged in the metal shield 4 (i.e., the metal shield 4 surrounds the outer side of the electronic components 2), so that the metal shield 4 can be used to effectively prevent the electronic components 2 from being interfered by external signals, thus providing a more stable operation of the electronic components 2.

The light permeable member 5 in the present embodiment is a transparent glass board having a rectangular shape, and in other embodiments of the present disclosure, the light permeable member 5 can include a light-diffusing polymer arranged on a bottom surface thereof. The light permeable member 5 is disposed on the frame 3, and is arranged in the accommodating slot 31. Specifically, the bottom surface of the light permeable member 5 is disposed on the annular bottom 311 of the accommodating slot 31, and the glue-receiving channel 312 is filled with an adhesive (not shown) so as to firmly adhere the light permeable member 5 onto the frame 3. A top surface of the light permeable member 5 does not protrude from any one of the two troughs 33 of the frame 3. (i.e., a position of the top surface of the light permeable member 5 is lower than that of any one of the two troughs 33).

Moreover, the light permeable member 5 is arranged above the metal shield 4, and the light permeable member 5 in the present embodiment is spaced apart from the metal shield 4, but the present disclosure is not limited thereto. The light permeable member 5 covers most of the metal shield 4 (e.g., only a part of the bent tail 422 is not covered by the light permeable member 5), so that the light permeable member 5 also covers the light emitting unit 21. In other words, light emitted from the light emitting unit 21 in the present embodiment can pass through the light permeable member 5 only through the opening 411 of the metal shield 4.

It should be noted that the connection relationship "the light emitting unit 21 is covered by the light permeable member 5" in the present embodiment can be regarded as "the light emitting unit 21 is arranged in a projecting region defined by orthogonally projecting the light permeable member 5 toward the substrate 1", but the present disclosure is not limited thereto.

The cover plate 6 in the present embodiment is flat and opaque, and the cover plate 6 has two protrusions 61 respectively arranged on two opposite ends thereof. The cover plate 6 further has a thru-hole 62 arranged adjacent to one of the two protrusions 61. Specifically, the cover plate 6 is disposed on the light permeable member 5 and is fixed to the frame 3, and the cover plate 6 and the light permeable member 5 in the present embodiment are spaced apart from each other, but the present disclosure is not limited thereto. The two protrusions 61 of the cover plate 6 are respectively disposed in the two troughs 33 of the frame 3, and a top surface of the cover plate 6 preferably does not protrude from the top side of the frame 3.

Moreover, the thru-hole 62 of the cover plate 6 corresponds in position to the light emitting unit 21, but does not correspond in position to the driver chip 23. In other words, the opening 411 of the metal shield 4 and the light emitting unit 21 are arranged directly under the thru-hole 62 of the cover plate 6, so that after the light emitted from the light emitting unit 21 passes through the opening 411 of the metal shield 4 and the light permeable member 5, the light can travel to the external space only through the thru-hole 62 of the cover plate 6. In other embodiments of the present disclosure, the thru-hole 62 can correspond in position to the light emitting unit 21 and the photodetector 22.

The detection unit 7 includes a detection circuit 71 and two transmission circuits 72 connected to the detection circuit 71. The detection circuit 71 in the present embodiment is formed on the bottom surface of the cover plate 6 (i.e., a surface of the cover plate 6 facing the light permeable member 5), and the detection circuit 71 extends from one of the two protrusions 61 of the cover plate 6 to the other one of the two protrusions 61 and detours around the thru-hole 62, but the shape or layout of the detection circuit 71 can be adjusted or changed according to design requirements.

Accordingly, the light source device 100 in the present embodiment is provided with the cover plate 6 disposed on the light permeable member 5, so that the light permeable member 5 can be effectively protected by the cover plate 6. Moreover, the cover plate 6 can provide for the opaque detection circuit 71 to be formed thereon so as to effectively reduce the material cost of the detection circuit 71.

Specifically, the surface of the cover plate 6 facing the light permeable member 5 in the present embodiment has a groove 63 recessed therein. The groove 63 is recessed from one of the two protrusions 61 to the other one of the two protrusions 61, thereby providing for the detection circuit 71 to be formed or disposed therein, but the present disclosure is not limited thereto. For example, in other embodiments of the present disclosure, the surface of the cover plate 6 facing the light permeable member 5 can be a flat surface (i.e., the cover plate 6 is provided without the groove 63).

Moreover, the two transmission circuits 72 are formed on the frame 3 and are respectively connected to two ends of the detection circuit 71, so that the detection circuit 71 can be electrically coupled to the upper electrode layer 12 through the two transmission circuits 72 (each having conductive adhesive). In the present embodiment, the two transmission circuits 72 are connected to the detection circuit 71 through the two troughs 33, respectively. The two transmission circuits 72 are respectively arranged in the two circuit grooves 35 of the frame 3, and each of the two transmission circuits 72 does not protrude from the corresponding circuit groove 35.

In addition, as shown in FIG. 4, the light source device 100 further includes two protection layers 9 respectively arranged in the two circuit grooves 35, and the two transmission circuits 72 are respectively embedded in the two protection layers 9, so that each of the two transmission circuits 72 can be effectively protected by the corresponding protection layer 9, but the present disclosure is not limited thereto. For example, in other embodiments of the present disclosure, the light source device 100 can be provided without the two protection layers 9, and the two transmission circuits 72 are exposed in the external space; or, the light source device 100 can be provided without the two protection layers 9, and the frame 3 is formed without the two circuit grooves 35, so that the two transmission circuits 72 are protrudingly formed on the outer surface of the frame 3.

Figure 6:
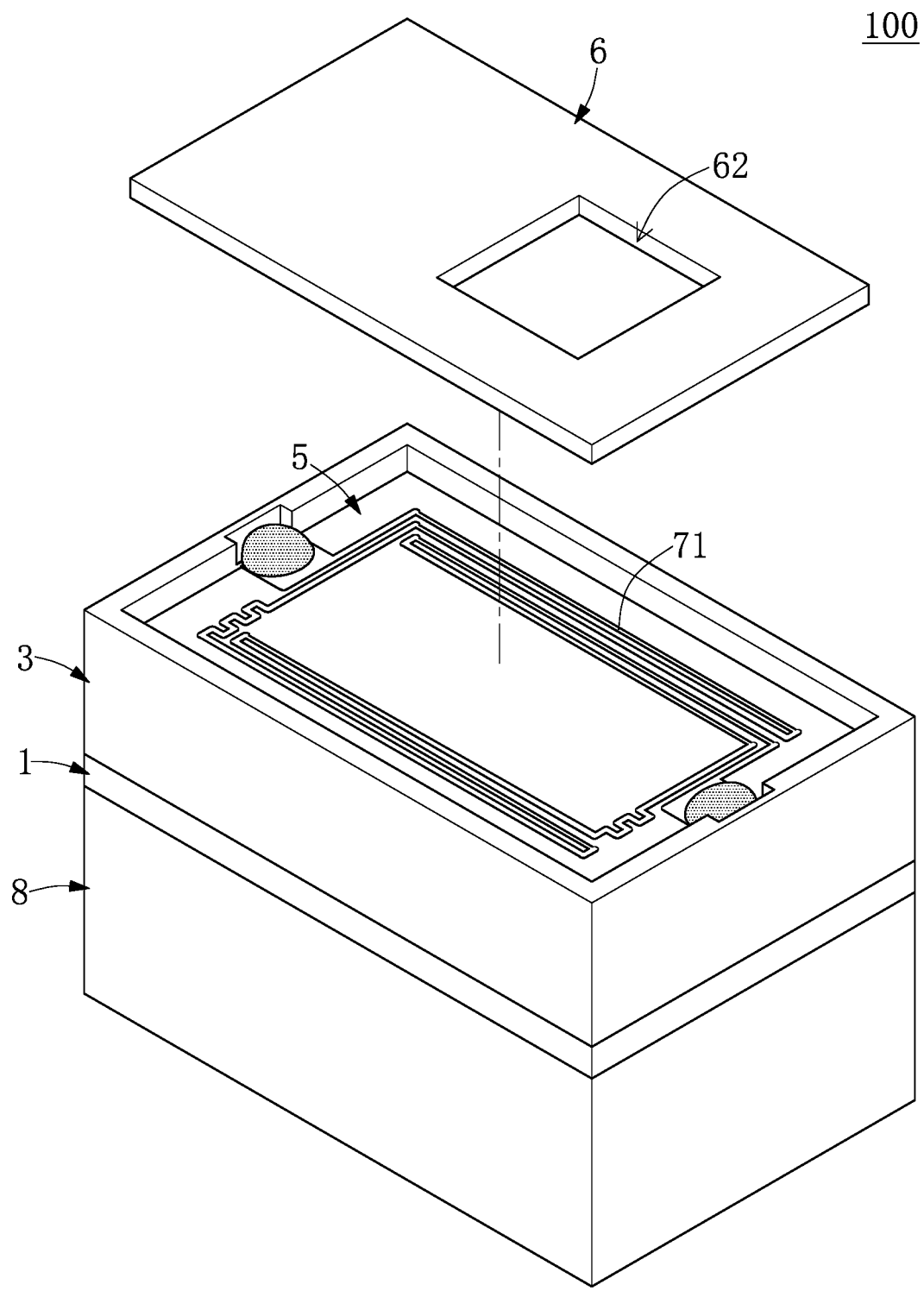
FIG. 6 is a perspective view showing the light source device, in which a detection circuit is formed on a light permeable member, according to the first embodiment of the present disclosure.
Figure 7:
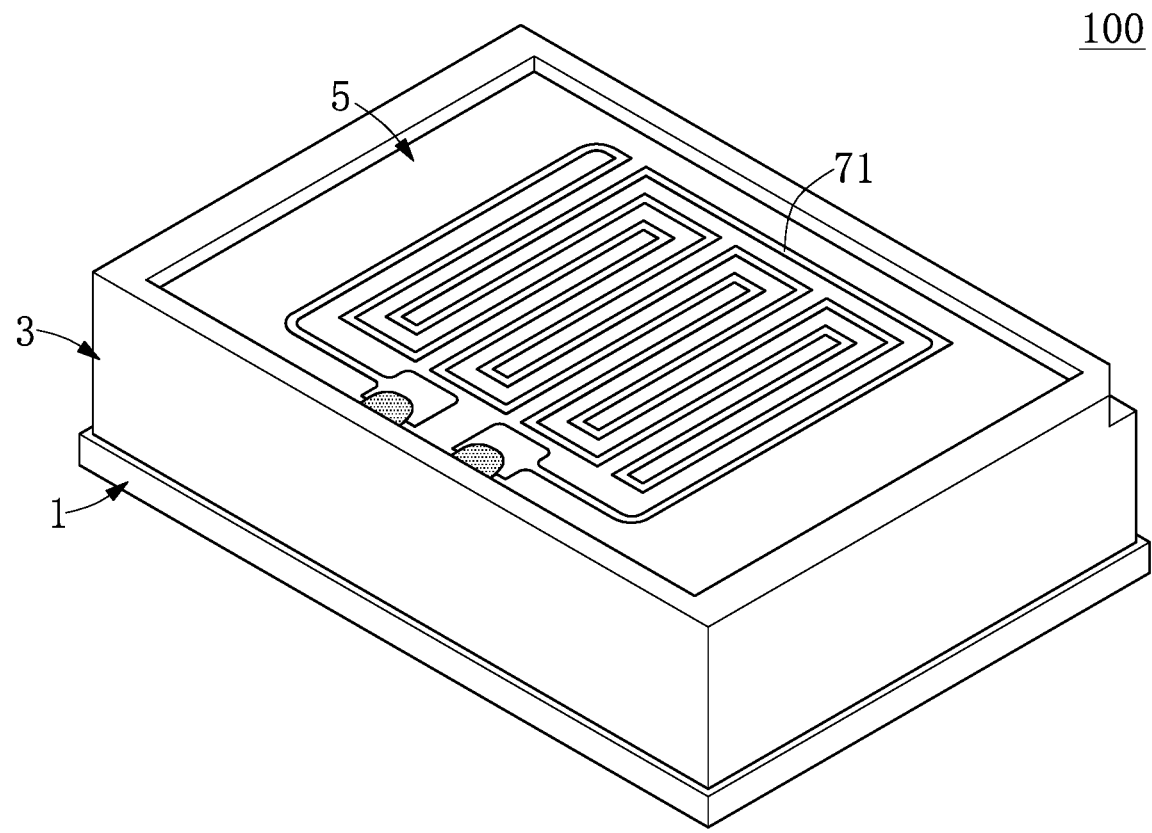
FIG. 7 is a perspective view showing the light source device without having a cover plate, in which the detection circuit is formed on the light permeable member, according to the first embodiment of the present disclosure.

It should be noted that the detection circuit 71 shown in FIG. 1 to FIG. 4 is formed on the cover plate 6, but the present disclosure is not limited thereto. For example, as shown in FIG. 6, the detection circuit 71 can be transparent and can be formed on the top surface of the light permeable member 5; or, as shown in FIG. 7, the transparent detection circuit 71 is formed on the top surface of the light permeable member 5, and the light source device 100 further omits the cover plate 6 and the uplift block 8. According to the structures shown in FIG. 3, FIG. 6, and FIG. 7, the detection circuit 71 of the present disclosure can be formed on at least one of the light permeable member 5 and the cover plate 6.

Moreover, one of the two transmission circuits 72 is connected to the signal pad 122 of the substrate 1, and the other one of the two transmission circuits 72 is electrically coupled to the ground pad 121 of the substrate 1 through the bent tail 422. In other words, the bent tail 422 in the present embodiment is sandwiched between the ground pad 121 and one of the two transmission circuits 72, but the present disclosure is not limited thereto. For example, in other embodiments of the present disclosure, the light source device 100 can be provided without the metal shield 4, one end of the two transmission circuits 72 of the detection unit 7 is connected to the detection circuit 71 through the two troughs 33, and the other end of the two transmission circuits 72 is directly connected to the signal pad 122 and the ground pad 121.

The uplift block 8 includes an insulating body 81, a top electrode layer 82 and a bottom electrode layer 83 respectively arranged on two opposite sides of the insulating body 81 and electrically coupled to each other, at least one heat-dissipation pillar 84, and a plurality of metal pillars 85. The at least one heat-dissipation pillar 84 and the metal pillars 85 are embedded in the insulating body 81. Specifically, the material of the insulating body 81 can be ceramic or plastic, and the insulating body 81 is a substantial cuboid. In other words, an outer surface of the insulating body 81 includes a top surface 811, a bottom surface 812, and a surrounding lateral surface 813 that is connected to the top surface 811 and the bottom surface 812.

The top electrode layer 82 is disposed on the top surface 811 of the insulating body 81, and the bottom electrode layer 83 is disposed on the bottom surface 812 of the insulating body 81. As a contour of the top electrode layer 82 is identical to a contour of the bottom electrode layer 83 and is also identical to a contour of the lower electrode layer 13 of the substrate 1, the following description only discloses the contour or structure of the top electrode layer 82 for the sake of brevity, but the present disclosure is not limited thereto. For example, in other embodiments of the present disclosure, the contour or structure of the top electrode layer 82 can be different from that of the bottom electrode layer 83.

Specifically, the top electrode layer 82 includes N number of heat-dissipation pads 821 and a plurality of metal pads 822 that are arranged around the N number of the heat-dissipation pads 821, and N is a positive integer more than one. An area of any one of the heat-dissipation pads 821 is greater than an area of any one of the metal pads 822. The metal pads 822 are in a rectangular ring-shaped arrangement (i.e., the metal pads 822 are arranged along four sides of the insulating body 81), and the number of the metal pads 822 along any one of the four sides of the insulating body 81 is greater than N. In the present embodiment, N is four, but the present disclosure is not limited thereto.

The number of the at least one heat-dissipation pillar 84 is defined as M that is a positive integer less than N. One end of the M number of the heat-dissipation pillar 84 is connected to the N number of the heat-dissipation pads 821 of the top electrode layer 82, and the other end of the M number of the heat-dissipation pillar 84 is connected to the heat-dissipation pads of the bottom electrode layer 83 (not labeled). In the present embodiment, M is two, but the present disclosure is not limited thereto. Moreover, the metal pillars 85 are arranged around the M number of the heat-dissipation pillar 84, one end of the metal pillars 85 is connected to the metal pads 822 of the top electrode layer 82, and the other end of the metal pillars 85 is connected to the metal pads 831 of the bottom electrode layer 83.

The substrate 1 is disposed on or mounted on the uplift block 8 to electrically couple to each other. The top electrode layer 82 is connected to the lower electrode layer 13 of the substrate 1, and the contour of the top electrode layer 82 is substantially identical to the contour of the lower electrode layer 13. Specifically, heat in the substrate 1 can be dissipated through the heat-dissipation pads 821 and the heat-dissipation pillars 84 of the uplift block 8, and a signal of the substrate 1 can be transmitted through the metal pads 822 and the metal pillars 85 of the uplift block 8.

Moreover, the light source device 100 in the present embodiment can change a height position of the light emitting unit 21 by mounting the substrate 1 onto the uplift block 8, thereby being applied to different height requirements or heat dissipation demand. Furthermore, the heat dissipation efficiency of the substrate 1 can be effectively increased through the structural design of the uplift block 8 of the present embodiment (e.g., the contour of the top electrode layer 82 is identical to that of the lower electrode layer 13 of the substrate 1).

Figure 8:
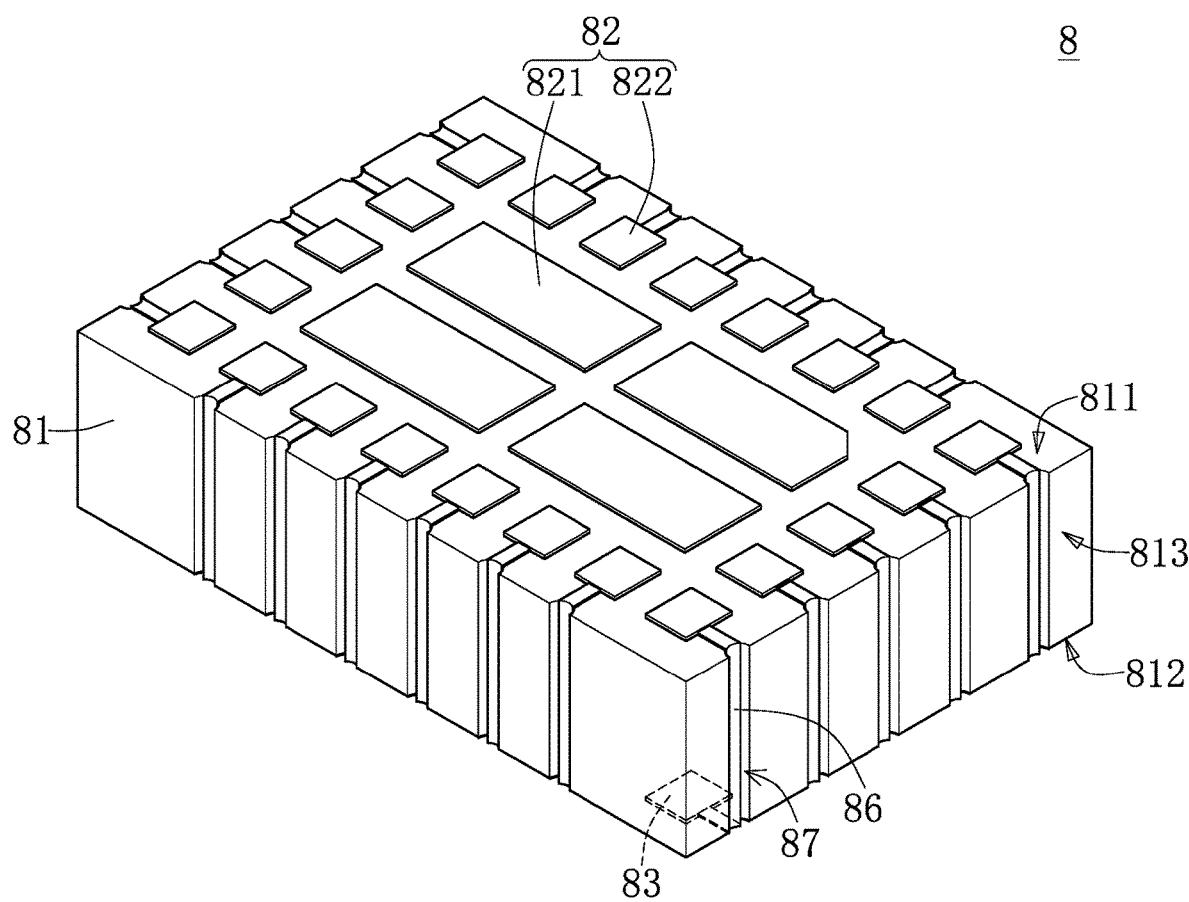
FIG. 8 is a perspective view of the uplift block in another configuration according to the first embodiment of the present disclosure.

In addition, the uplift block 8 of the present embodiment are formed as shown in FIG. 1 to FIG. 4, but the uplift block 8 can be adjusted or changed according to design requirements. For example, as shown in FIG. 8, the uplift block 8 includes an insulating body 81, a top electrode layer 82 and a bottom electrode layer 83 respectively disposed on two opposite sides of the insulating body 81 and electrically coupled to each other, and a plurality of extension circuits 86 that are formed on the surrounding lateral surface 813. The extension circuits 86 are formed to connect the top electrode layer 82 and the bottom electrode layer 83. In other words, the metal pads 822 of the top electrode layer 82 are electrically coupled to the metal pads (not labeled) of the bottom electrode layer 83 through the extension circuits 86, respectively, so that the extension circuits 86 of the uplift block 8 can be used to replace the metal pillars 85. Moreover, the contour of the top electrode layer 82 is also substantially identical to that of the bottom electrode layer 83.

Specifically, as shown in FIG. 8, the insulating body 81 has a plurality of trenches 87 recessed in the surrounding lateral surface 813. Each of the trenches 87 straightly extends from the top surface 811 to the bottom surface 812. The extension circuits 86 are respectively arranged in the trenches 87, and any one of the extension circuits 86 in the present embodiment extends from one of the metal pads 822 of the top electrode layer 82 to a corresponding one of the metal pads (not labeled) of the bottom electrode layer 83 by traveling through the corresponding trench 87. Accordingly, when the uplift block 8 is disposed on a circuit board (not shown), the uplift block 8 and the circuit board can be electrically connected to each other by a laser welding manner or a surface mount technology (SMT) manner.

Second Embodiment

Figure 9:
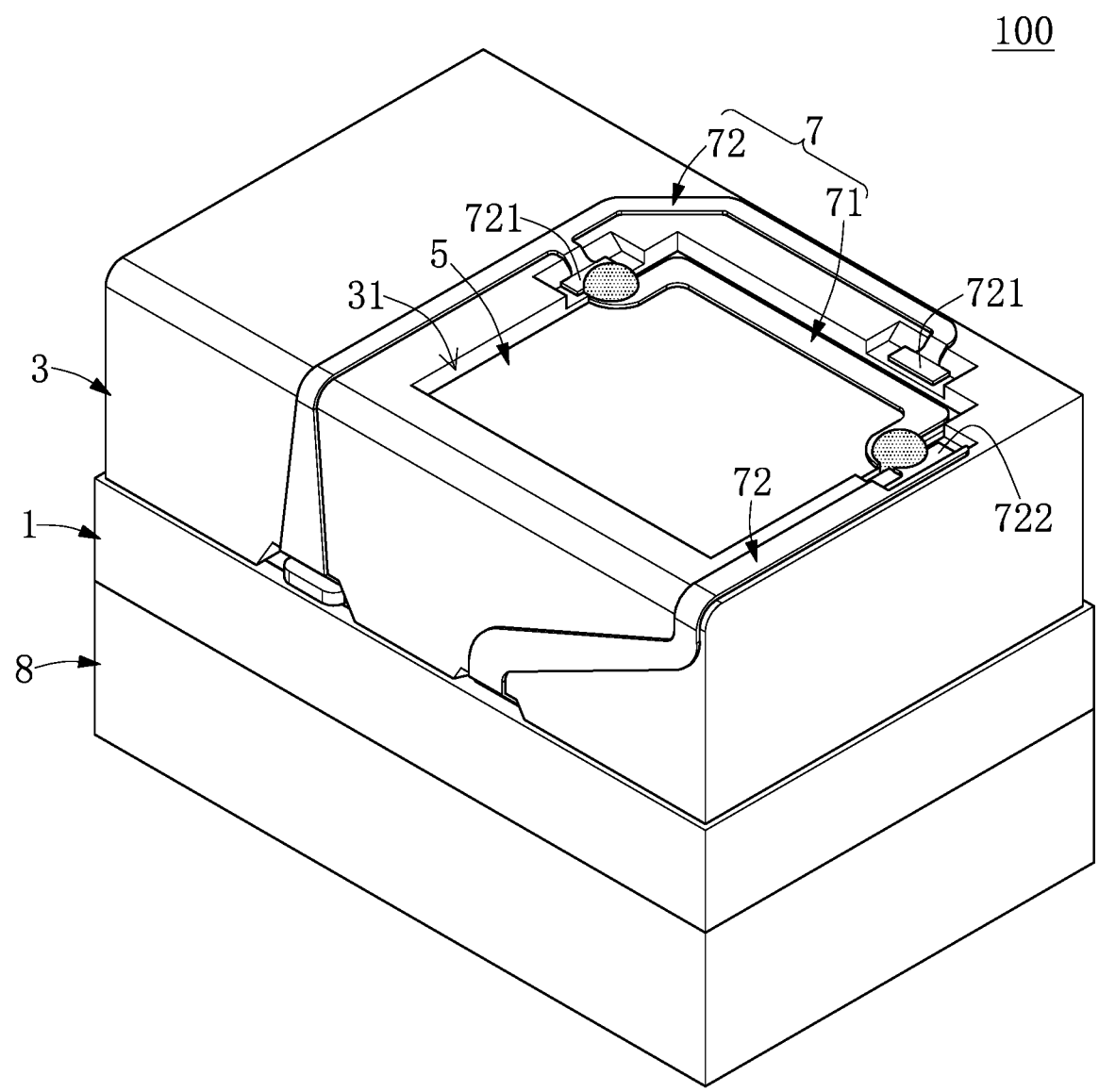
FIG. 9 is a perspective view of a light source device according to a second embodiment of the present disclosure.
Figure 10:
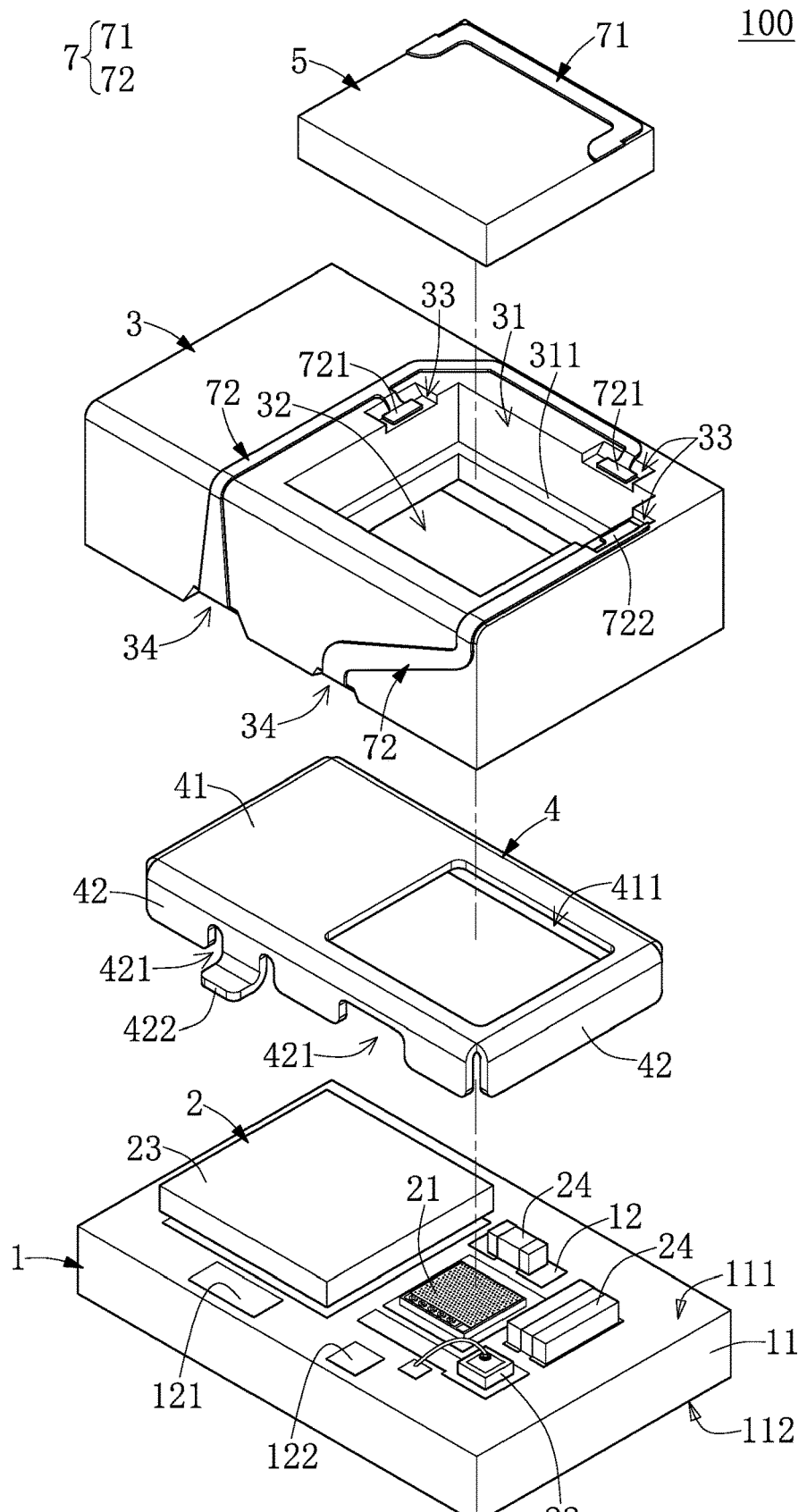
FIG. 10 is an exploded view of FIG. 9.
Figure 11:
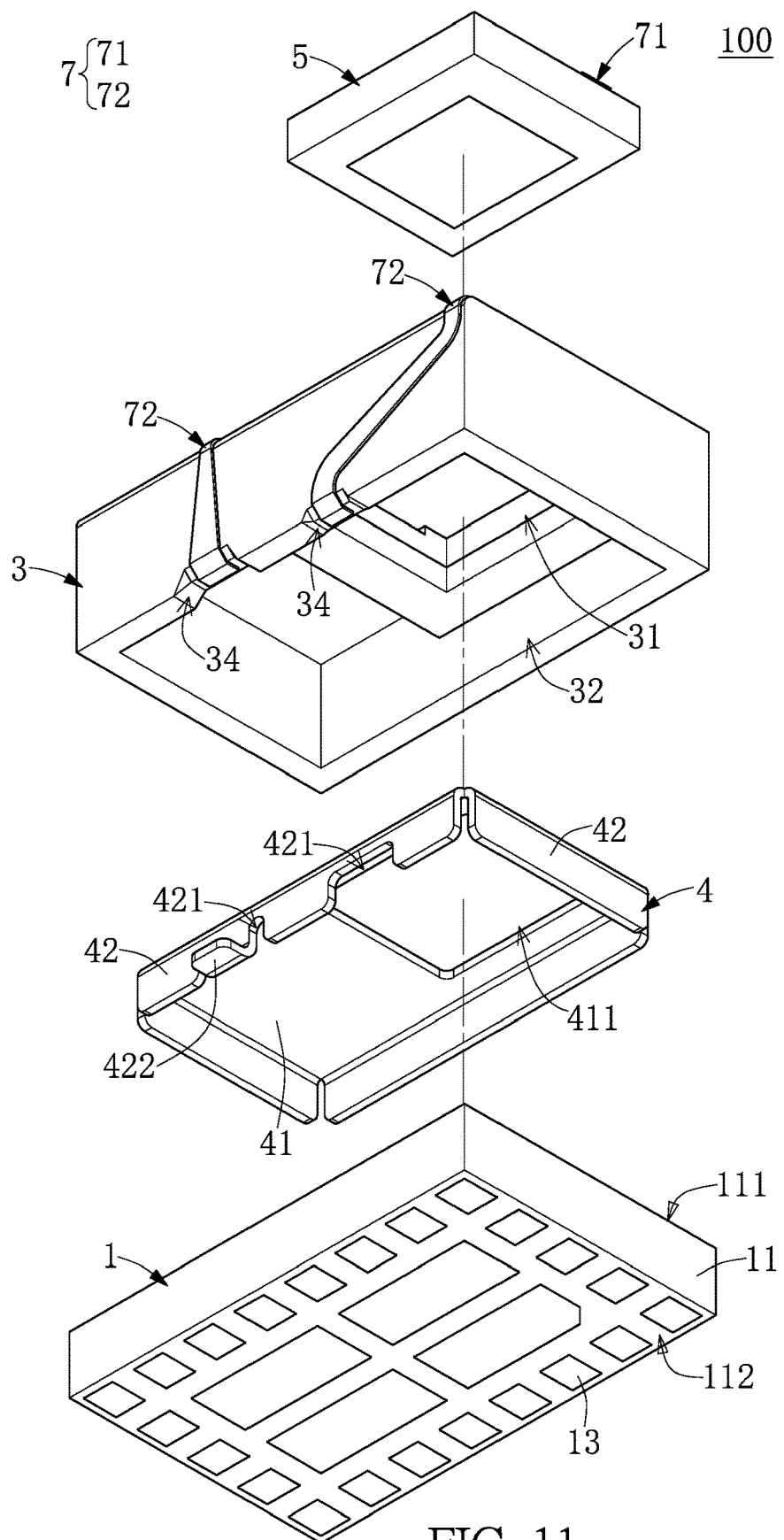
FIG. 11 is an exploded view of FIG. 9 from another angle of view.

Referring to FIG. 9 to FIG. 11, a second embodiment of the present disclosure is similar to the first embodiment of the present disclosure. For the sake of brevity, descriptions of the same components in the first and second embodiments of the present disclosure (e.g., the substrate 1, the electronic components 2, the metal shield 4, and the uplift block 8) will be omitted, and the following description only discloses different features between the first and second embodiments.

In the present embodiment, the light source device 100 is provided without the cover plate 6 and the protection layers 9, and the frame 3 has an accommodating slot 31 recessed in the top side thereof. The accommodating slot 31 corresponds in position and shape to the opening 411 of the metal shield 4 (e.g., at least part of the driver chip 23 is covered by the metal shield 4 and the frame 3), and the frame 3 also has the glue-receiving channel and the air vent (not shown) recessed in the annular bottom 311. Specifically, the bottom of the accommodating slot 31 of the frame 3 is in spatial communication with the opening 411, and the frame 3 has three troughs 33 recessed in the top side thereof. The three troughs 33 are spaced apart from each other and are in spatial communication with the accommodating slot 31, and the outer surface of the frame 3 is not formed with any circuit groove, but the present disclosure is not limited thereto.

The light permeable member 5 is disposed in the accommodating slot 31 and covers the light emitting unit 21. In other words, light emitted from the light emitting unit 21 in the present embodiment can pass through the light permeable member 5 only by passing through the opening 411 of the metal shield 4. Moreover, the detection circuit 71 is formed on the top surface of the light permeable member 5, the two transmission circuits 72 are formed on the outer surface of the frame 3, and the detection circuit 71 is electrically coupled to the ground pad 121 and the signal pad 122 of the upper electrode layer 12 through the two transmission circuits 72.

Specifically, the transmission circuit 72 connected to the signal pad 122 has a signal contact 722 connected to the detection circuit 71, the transmission circuit 72 connected to the ground pad 121 has two ground contacts 721, and the signal contact 722 and the two ground contacts 721 are respectively arranged in the three troughs 33. The two ground contacts 721 are selectively connected to the detection circuit 71. In other words, the detection circuit 71 is formed by being extended from the signal contact 722 to one of the two ground contacts 721 according to design requirements (e.g., an impedance matching). For example, in other embodiments of the present disclosure, the detection circuit 71 is arranged at two adjacent edges of the light permeable member 5, and is connected to the signal contact 722 and the ground contact 721 that is adjacent to the signal contact 722.

However, the number of the troughs 33 of the frame 3 can be adjusted or changed according to design requirements. For example, in other embodiments of the present disclosure, the number of the troughs 33 of the frame 3 can be two, the transmission circuit 72 connected to the ground pad 121 has only one ground contact 721, and the signal contact 722 and the ground contact 721 are respectively arranged in the two troughs 33 of the frame 3.

In addition, the light permeable member 5 in the present embodiment is disposed in the accommodating slot 31 of the frame 3, but the connection relationship between the light permeable member 5 and the frame 3 is not limited by FIG. 9 and can be adjusted or changed according to design requirements.

Third Embodiment

Figure 12:
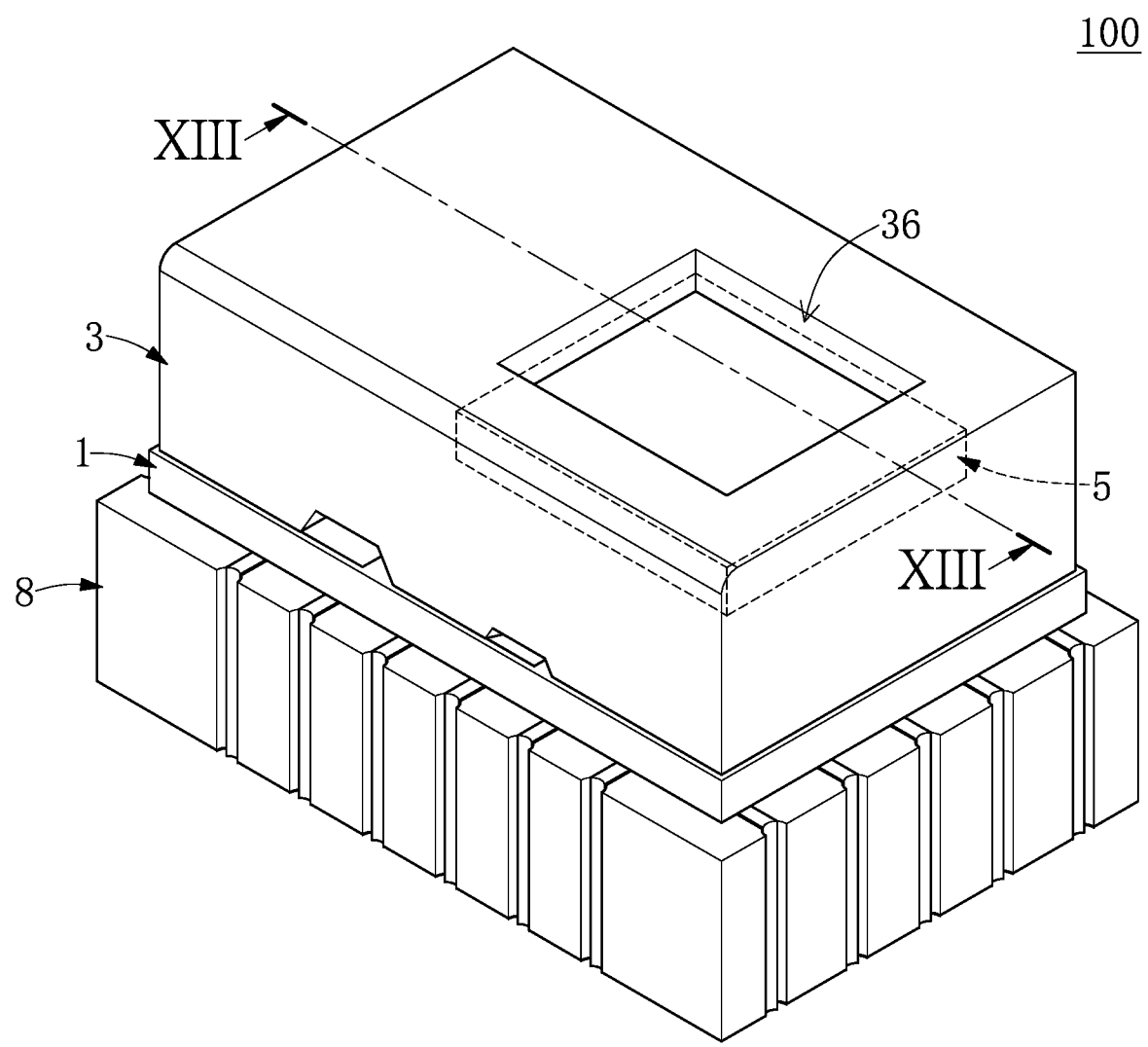
FIG. 12 is a perspective view of a light source device according to a third embodiment of the present disclosure.
Figure 13:
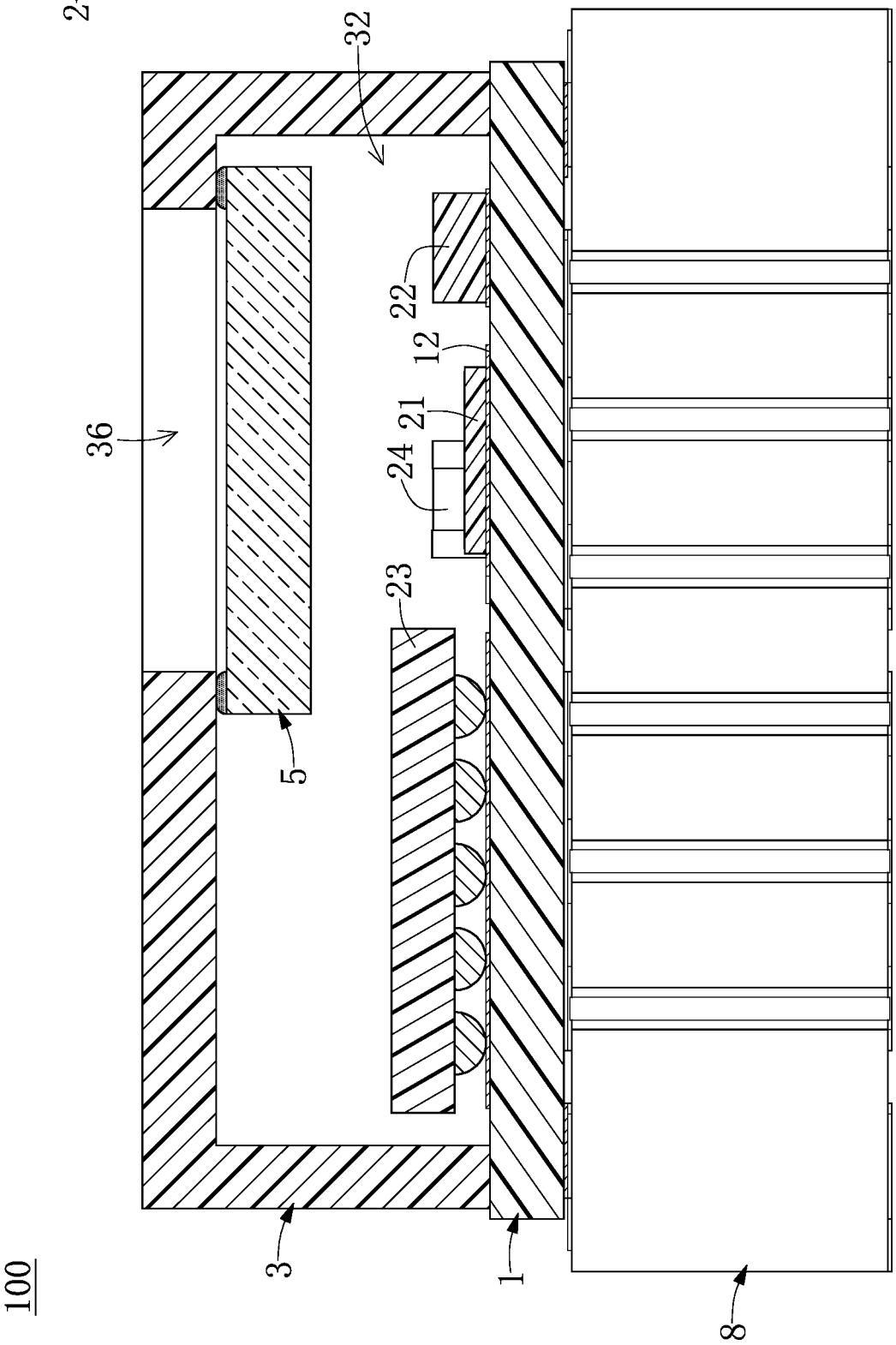
FIG. 13 is a cross-sectional view taken along line XIII-XIII of FIG. 12.

Referring to FIG. 12 and FIG. 13, a third embodiment of the present disclosure is similar to the second embodiment of the present disclosure. For the sake of brevity, descriptions of the same components in the third and second embodiments of the present disclosure will be omitted, and the following description only discloses different features between the third and third embodiments.

In the present embodiment, the frame 3 does not have the accommodating slot 31 that is used to receive the light permeable member 5. Specifically, the frame 3 has a light permeable opening 36 corresponding in position to the light emitting unit 21, the light permeable member 5 is arranged inside of the frame 3 and covers a bottom side of the light permeable opening 36. In other words, the light permeable member 5 is arranged in the accommodating space 32 of the frame 3, and the light permeable member 5 is adhered to an inner surface of an upper portion of the frame 3 in a reversely bonding manner. The light source device 100 can be provided with the detection unit 7 such as that in the above embodiments. For example, the transmission circuits 72 of the detection unit 7 can be formed inside of the frame 3 or outside of the frame 3 (e.g., the second embodiment), and the detection circuit 71 of the detection unit 7 can be disposed on the top surface or the bottom surface of the light permeable member 5. In addition, the light source device 100 of the present disclosure can be provided without the detection unit 7 according to design requirements.

Fourth Embodiment

Figure 14:
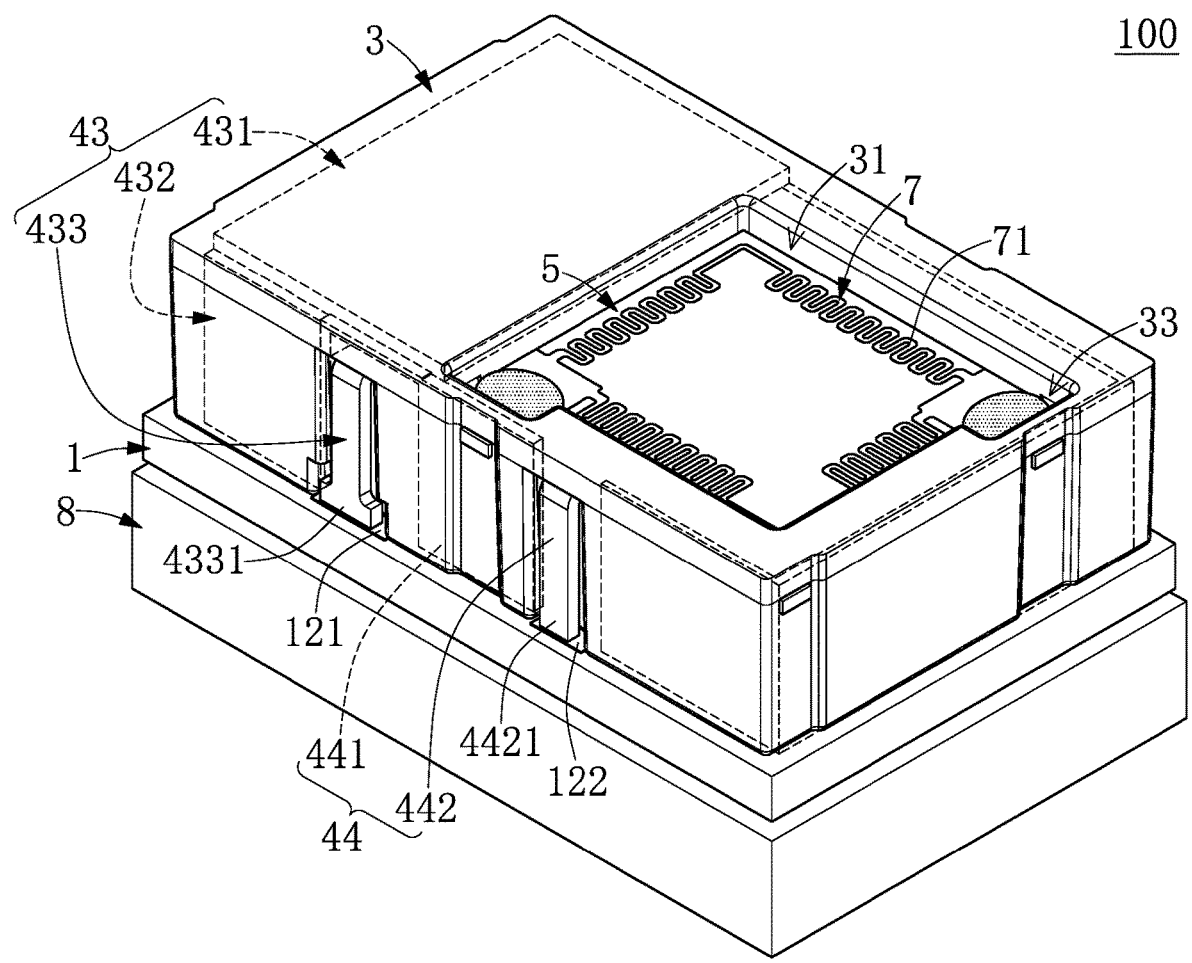
FIG. 14 is a perspective view of a light source device according to a fourth embodiment of the present disclosure.

Referring to FIG. 14, a fourth embodiment of the present disclosure is similar to the first to third embodiments of the present disclosure. For the sake of brevity, descriptions of the same components in the first to fourth embodiments of the present disclosure (e.g., the substrate 1, the electronic components 2, and the uplift block 8) will be omitted, and the following description only discloses different features between the fourth embodiment and the first to third embodiments.

In the present embodiment, the light source device 100 is provided without the cover plate 6 and the protection layers 9, at least part of the metal shield 4 is embedded in the frame 3, the detection unit 7 does not include the transmission circuits 72, and the detection circuit 71 is formed on the light permeable member 5. The detection circuit 71 in the present embodiment is arranged along four edges of the top surface of the light permeable member 5, but the present disclosure is not limited thereto.

Specifically, the metal shield 4 includes a ground segment 43 and a signal segment 44 that is separate from the ground segment 43, and an area of the ground segment 43 is greater than that of the signal segment 44. The ground segment 43 and the signal segment 44 are connected to the detection circuit 71 through the two troughs 33, respectively. The ground segment 43 is connected to the ground pad 121, and the signal segment 44 is connected to the signal pad 122.

The ground segment 43 includes a top plate 431 embedded in the frame 3, a C-shaped portion 432 embedded in the frame 3, and a ground arm 433 that is exposed from an outer lateral surface of the frame 3. The top plate 431 corresponds in position to a top surface of the frame 3 and is arranged at one side of the accommodating slot 31. The C-shaped portion 432 is connected to the top plate 431 and has four corners respectively corresponding in position to four corners of the frame 3, and the C-shaped portion 432 is connected to the detection circuit 71. The ground arm 433 is connected to the C-shaped portion 432 and is arranged between two free ends of the C-shaped portion 432, and a free end 4331 of the ground arm 433 is connected to the ground pad 121.

Moreover, the signal segment 44 is arranged between the two free ends of the C-shaped portion 432 (or is arranged between the ground arm 433 and one of the two free ends of the C-shaped portion 432). The signal segment 44 includes a connecting portion 441 embedded in the frame 3 and a signal arm 442 exposed from the outer lateral surface of the frame 3. The connecting portion 441 is connected to the detection circuit 71 and the signal arm 442, and a free end 4221 of the signal arm 442 is connected to the signal pad 122.

In summary, a portion of the metal shield 4 exposed from the frame 3 only includes the ground arm 433 and the signal arm 442, and the other portion of the metal shield 4 (e.g., the top plate 431, the C-shaped portion 432, the connecting portion 441) is embedded in the frame 3, but the present disclosure is not limited thereto.

Fifth Embodiment

Figure 15:
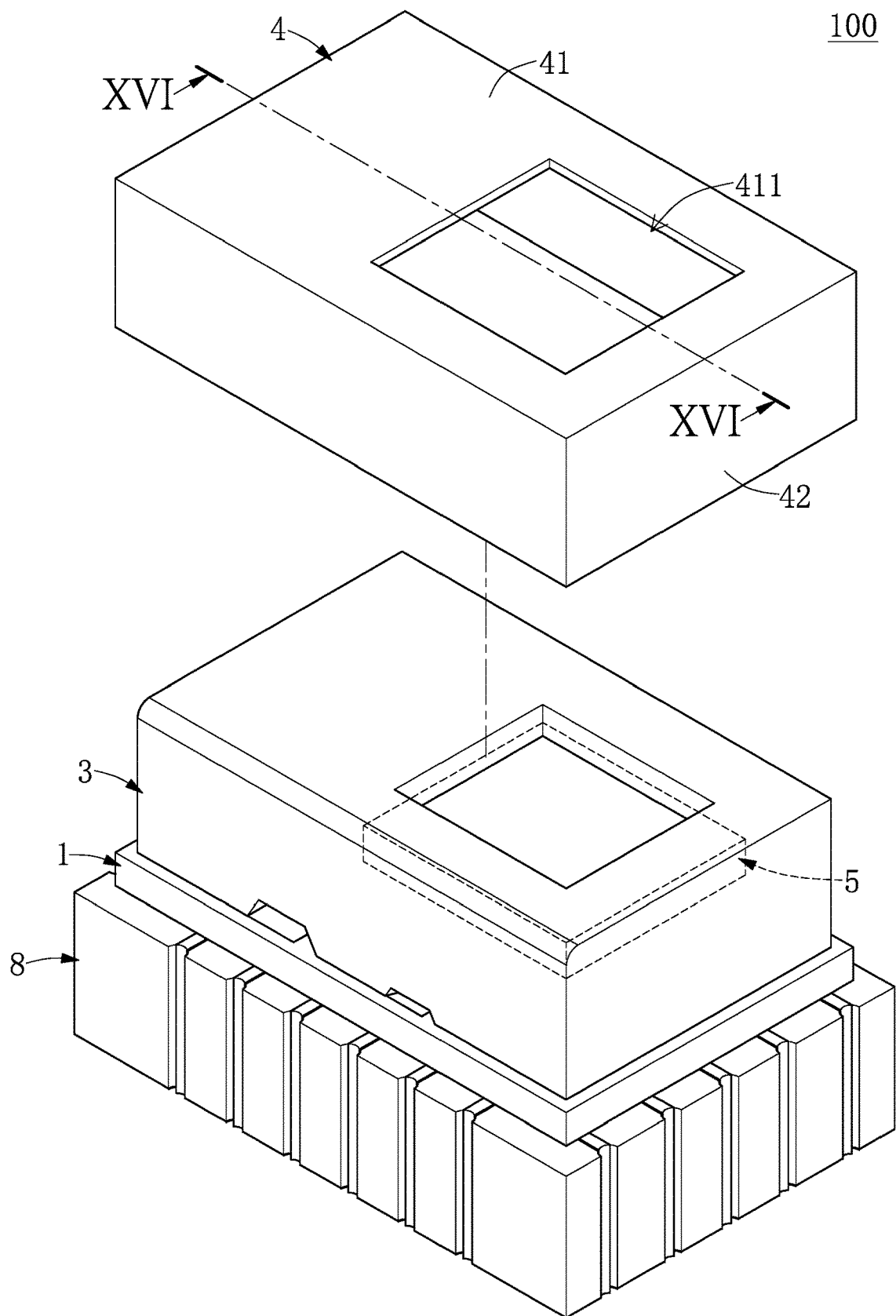
FIG. 15 is a perspective view of a light source device according to a fifth embodiment of the present disclosure.

Referring to FIG. 15 and FIG. 16, a fifth embodiment of the present disclosure is similar to the first to fourth embodiments of the present disclosure. For the sake of brevity, descriptions of the same components in the first to fifth embodiments of the present disclosure (e.g., the substrate 1, the electronic components 2, and the uplift block 8) will be omitted, and the following description only discloses different features between the fifth embodiment and the first to fourth embodiments.

In the present embodiment, the metal shield 4 is disposed outside of the frame 3 and is attached onto the outer surface (e.g., the top surface and the outer lateral surface) of the frame 3. The metal shield 4 includes a main plate 41 and a side plate 42 that has a ring shape and is connected to a peripheral edge of the main plate 41. The main plate 41 has an opening 411 corresponding in position and shape to the light permeable member 5. Moreover, the main plate 41 and the side plate 42 of the metal shield 4 cover the outer surface of the frame 3, thereby preventing the electronic components 2 of the frame 3 from being interfered by external signals. It should be noted that an outer surface of the side plate 42 of the metal shield 4 is flush with four edges of the substrate 1, so that the light source device 100 can be used to effectively resist electromagnetic interference (EMI). The metal shield 4 in the present embodiment is directly sleeved around the frame 3, so that when the light source device 100 is assembled by a module manufacturer, the metal shield 4 does not need to be assembled in an additional process for simplifying the assembling process. In addition, in other embodiments of the present disclosure, the metal shield 4 can be formed with a bent tail, so that the metal shield 4 can be connected to the ground pad 121 of the substrate 1 through the bent tail. The metal shield 4 of the present embodiment is disposed on the substrate 1 and is sleeved around the frame 3. However, it is not limited to outer surface of the metal shield 3 needs to be flush with the edges of the substrate 1. For example, an outer surface of the side plate 42 is protruded from the at least one edge of the substrate 1; or, a projection area defined by orthogonally projecting the side plate 42 onto the substrate 1 is located inside of four edges of the substrate 1.

In conclusion, the light source device of the present disclosure is different from the TO-CAN structure so as to meet the different requirements. Specifically, the light emitting unit, the photodetector, the driver chip, and the capacitors in the present disclosure are integrated in the light source device, so that signal transmission path of the electronic components can be effectively shortened to reduce an inductance of the light source device. Moreover, the driver chip of the light source device is embedded in the board, so that the size of the light source device can be effectively reduced and the inductance of the light source device can be further reduced.

The light source device in the present disclosure can change a height position of the light emitting unit by disposing the uplift block under the substrate, thereby being adaptable to different height requirements. Furthermore, the heat dissipation efficiency of the substrate can be effectively increased through the structural design of the uplift block of the present embodiment (e.g., the top electrode layer, the lower electrode layer, the heat-dissipation pillar, the metal pillar, and/or the extension circuit).

The light source device in the present disclosure is formed with the electronic components arranged in the metal shield (i.e., the metal shield surrounds the outer side of the electronic components), so that the metal shield can be used to effectively prevent the electronic components from being interfered by external signals, thus providing a more stable operation of the electronic components.

The light source device in the present disclosure is provided with the cover plate disposed on the light permeable member, so that the light permeable member can be effectively protected by the cover plate. Moreover, the cover plate can provide for the detection circuit to be formed thereon so as to effectively reduce the material cost of the detection circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source device, comprising:
a substrate including a board, an upper electrode layer, and a lower electrode layer, wherein the upper electrode layer and the lower electrode layer are respectively disposed on two opposite sides of the board, and are electrically coupled to each other, and wherein the upper electrode layer includes a ground pad;
a light emitting unit disposed on the upper electrode layer;
a frame disposed on the substrate and surrounding an outer side of the light emitting unit;
a metal shield fixed to an inner side of the frame and connected to the ground pad, wherein the metal shield surrounds the outer side of the light emitting unit; and
a light permeable member disposed on the frame and covering the light emitting unit and the metal shield.

2. The light source device according to claim 1, further comprising a cover plate, a detection circuit, and two transmission circuits, wherein the detection circuit is formed on the cover plate, the two transmission circuits are formed on the frame, and the detection circuit is electrically coupled to the upper electrode layer through the two transmission circuits.

3. The light source device according to claim 1, further comprising a detection circuit and two transmission circuits, wherein the detection circuit is formed on the light permeable member, the two transmission circuits are formed on the frame, and the detection circuit is electrically coupled to the upper electrode layer through the two transmission circuits.

4. The light source device according to claim 3, wherein the upper electrode layer includes a signal pad, and the metal shield includes a bent tail connected to the ground pad, and wherein one of the two transmission circuits is connected to the signal pad, and the other one of the two transmission circuits is electrically coupled to the ground pad through the bent tail.

5. The light source device according to claim 4, wherein the transmission circuit connected to the signal pad has a signal contact connected to the detection circuit, and the transmission circuit electrically coupled to the ground pad has two ground contacts selectively connected to the detection circuit.

6. The light source device according to claim 1, further comprising a driver chip that is disposed on the upper electrode layer or is embedded in the board, wherein the driver chip is electrically coupled to the light emitting unit and is configured to drive the light emitting unit, and the metal shield covers the driver chip and has an opening corresponding in position to the light emitting unit.

7. The light source device according to claim 6, further comprising the driver chip embedded in the board, wherein the driver chip is electrically coupled to the light emitting unit and the lower electrode layer through an inner circuit unit embedded in the board.

8. The light source device according to claim 1, wherein the metal shield comprises a main plate and at least one side plate extending from an edge of the main plate, and the main plate has an opening corresponding in position to the light emitting unit.

9. The light source device according to claim 8, wherein the side plate includes two concavities respectively corresponding in position to the ground pad and a signal pad of the substrate.

10. The light source device according to claim 9, wherein the metal shield includes a bent tail connected to the ground pad, and the bent tail of the metal shield is formed by being extended from one of the two concavities that is arranged away from the opening.

11. The light source device according to claim 10, further comprising two transmission circuits formed on the frame, wherein the frame has two notches recessed in a bottom side thereof, and the two notches respectively correspond in position to the ground pad and the signal pad, and wherein a lower surface of the bent tail is connected to the ground pad and is arranged in the corresponding notch, and the upper surface of the bent tail is connected to one of the two transmission circuits.

12. A light source device, comprising:
a substrate including a board, an upper electrode layer, and a lower electrode layer, wherein the upper electrode layer and the lower electrode layer are respectively disposed on two opposite sides of the board, and are electrically coupled to each other, and wherein the upper electrode layer includes a ground pad;

a light emitting unit disposed on the upper electrode layer;

a frame disposed on the substrate and arranged around an outer side of the light emitting unit;

a light permeable member disposed on the frame and covering the light emitting unit; and a metal shield at least partially embedded in the frame and connected to the ground pad, wherein the metal shield is arranged around the outer side of the light emitting unit.

13. The light source device according to claim 12, further comprising a detection circuit formed on the light permeable member, wherein the upper electrode layer includes a signal pad, the metal shield includes a ground segment and a signal segment that is separate from the ground segment, and an area of the ground segment is greater than that of the signal segment, and wherein the ground segment and the signal segment are connected to the detection circuit, the ground segment is connected to the ground pad, and the signal segment is connected to the signal pad.

14. The light source device according to claim 13, wherein the ground segment has a ground arm exposed from an outer lateral surface of the frame, and a free end of the ground arm is connected to the ground pad, and wherein the signal segment has a signal arm exposed from the outer lateral surface of the frame, and a free end of the signal arm is connected to the signal pad.

15. The light source device according to claim 13, wherein the ground segment includes a C-shaped portion having four corners respectively corresponding in position to four corners of the frame, and the signal segment is arranged between two free ends of the C-shaped portion.

* * * * *